Nov. 17, 1970 N. SZEREMY ET AL 3,541,454
AUTOMATIC GAIN CONTROL FOR HYBRID RECEIVER
Filed Sept. 28, 1967
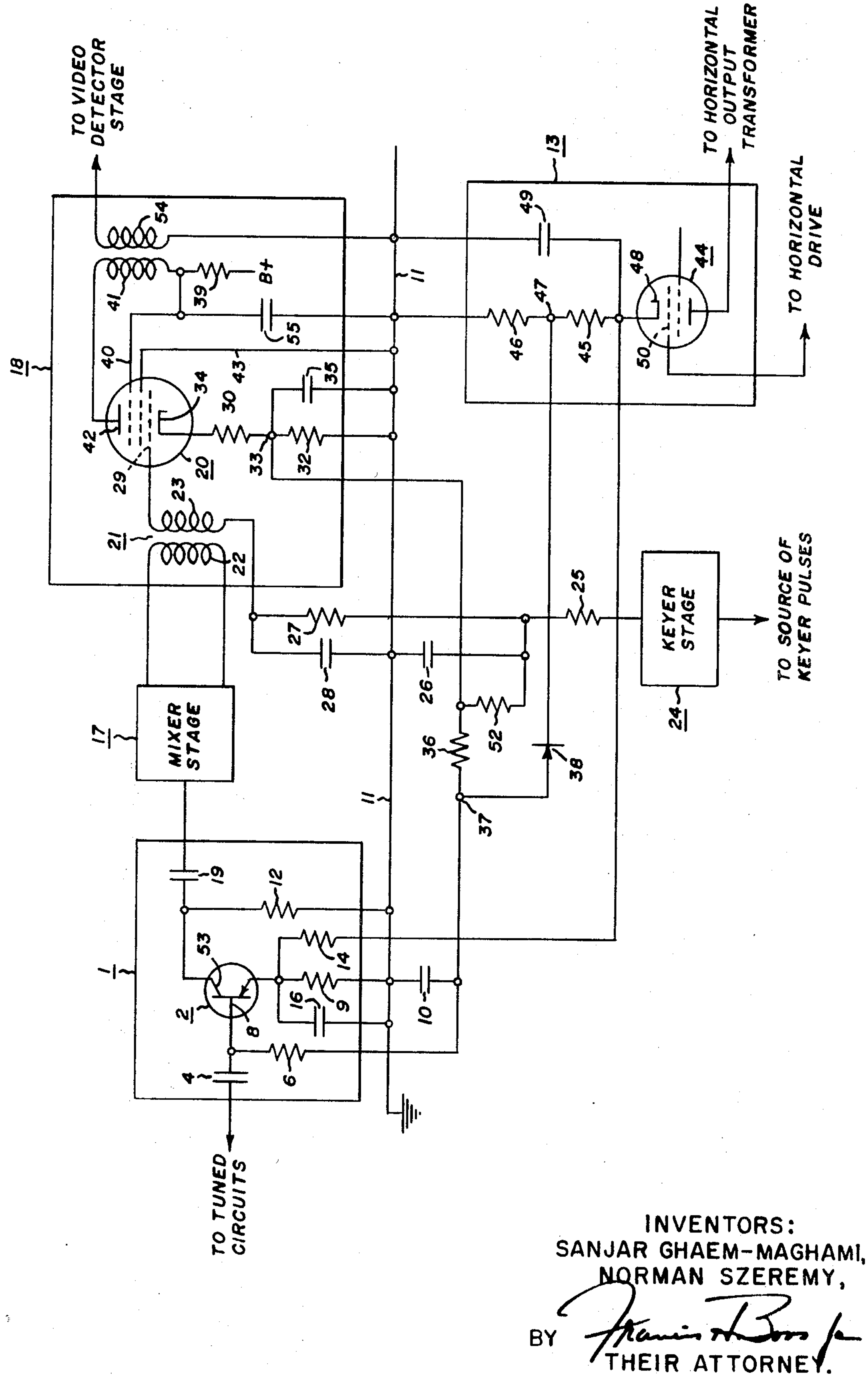
INVENTORS:
SANJAR GHAEM-MAGHAMI,
NORMAN SZEREMY,
BY [signature]
THEIR ATTORNEY.

United States Patent Office 3,541,454
Patented Nov. 17, 1970

3,541,454
AUTOMATIC GAIN CONTROL FOR HYBRID RECEIVER

Norman Szeremy, Syracuse, N.Y., and Sanjar Ghaem-Maghami, Chesapeake, Va., assignors to General Electric Company, a corporation of New York Filed Sept. 28, 1967, Ser. No. 671,326
Int. Cl. H04b *1/16*
U.S. Cl. 325—408 7 Claims

ABSTRACT OF THE DISCLOSURE

In a keyed automatic gain control, an AGC chain series resistor combination connects an intermediate terminal on a first cathode series resistor combination of an IF tube amplifier to the base terminal of an RF transistor amplifier. An intermediate terminal of the AGC chain series resistor combination is connected to an intermediate terminal on a second cathode series resistor combination of a horizontal output tube amplifier through a delay diode. Under a weak signal condition at the base terminal of the RF transistor amplifier, the delay diode is forward biased to attain an RF AGC delay.

BACKGROUND OF THE INVENTION

In the electronics industry including the communications area, there is a far ranging trend toward conversion to solid state circuitry. Perhaps, this trend is most strongly felt in the communications area where consumers are currently seeking reduced dimensions if not portability in the devices they are buying for their homes. As a consequence, solid state circuitry has been looked to in many applications in which the tube was formally considered a standard building block. Yet, the transition is not complete and may never be since the transistor cannot be considered a one-for-one equivalent to the tube. In fact, certain applications are best suited to a hybrid solid state-vacuum tube environment. It is in such a hybrid environment that this invention finds its place.

More specifically, the television receivers of today may utilize a transistor in one stage while necessitating the use of a vacuum tube in yet another stage. Although the selective substitution may sound simple, it may create some rather complex problems when one considers the rather complex interaction between the various stages. However, this interaction need not prohibit the use of a hybrid system if the diverse devices are used in a complementary fashion.

Perhaps, one of the most complex yet indispensable interactions between diverse stages of a television receiver is that of an automatic gain control wherein the RF stage has been transistorized. In order to function appropriately, the input impedance as seen at the RF stage must be low. Yet, in many cases the automatic gain control necessitates the coupling of the input to a delay network, conventionally, a diode.

The delay itself is necesary since it is desirable that the automatic gain control reduce the gain of the IF stage by a substantial amount before a reduction in gain of the RF stage occurs. Such a delay serves to maintain a good signal-to-noise ratio of a television receiver which must be inversely proportional to the gain reduction in the RF amplifier stage. The delay in reduction of the RF gain is particularly important in the case of weak signals since the signal-to-noise ratio is critical. However, the delay must not be overextended and once it has terminated, the RF gain control voltage must rise rapidly.

Conventional diode circuits have provided appropriate delay by clamping the AGC line for the gain control grid of an RF tube amplifier to a high potential high impedance voltage supply available at many points within a vacuum tube system. Thus, the diode would short the RF grid D.C. voltage to the high impedance supply until the potential at the RF AGC voltage rose to a sufficient level to reverse bias the diode thereby effecting a delay.

However, in a hybrid receiver, the diode must be coupled to a low impedance source of sufficient voltage in order to provide the necessary short circuit between the delay source voltage and the low impedance RF AGC source voltage. Since a low impedance source of sufficient voltage is required, for delay, a vacuum tube IF stage cathode circuit is inadequate because the current therein is too low to provide a sufficient voltage across the necessary low cathode impedance, or, if the voltage is made sufficient, the impedance has to be raised above the tolerable level. Although circuitry might be added to the hybrid receiver to obtain the necessary voltage drop from a typical tube bias supply, the result of such an addition would be increased expense. This invention sets forth means attaining a low impedance source of sufficient voltage and avoiding any increased expense while still providing the necessary delay for the RF AGC without limiting the operation of the IF tube stage.

SUMMARY OF THE INVENTION

In one embodiment, the invention relates to an improved delay network for a keyed automatic gain control to be used in a television receiver comprising a transistorized RF stage, an IF stage employing a vacuum tube, and circuit means including a high current vacuum tube with a low impedance circuit connected to the anode-cathode circuit thereof. A cathode circuit connected to the cathode of a regulated IP stage provides a gain control bias for a gain control electrode in the transistorized RF stage, which bias is delayed by a diode which clamps the RF AGC chain to the cathode circuit of the high current vacuum tube stage.

BRIEF DESCRIPTION OF THE DRAWINGS

This specification concludes with claims particularly pointing out and distinctly claiming the subject matter which I regard as my invention. The invention may also be understood from the following description taken in connection with the accompanying drawings in which:

FIG. 1 is a schematic diagram of the affected stages of a television receiver circuit.

DESCRIPTION OF THE PREFERRED EMBODIMENT

As shown in FIG. 1, the hybrid television receiver comprises a transistorized RF stage 1 and one of several possible regulated vacuum tube IF stages 18 coupled through a mixer stage 17 and regulated by an automatic gain control voltage from a keyer stage 24. A horizontal output stage 13 is utilized to appropriately bias a delay diode 38 to control the level of application of the automatic gain control voltage to the RF stage 1 through an AGC chain.

In detail, the RF stage 1 comprises a PNP transistor amplifier 2 providing a first element of a hybrid transistor-vacuum tube combination. As shown, the RF amplification is effected by a single transistor coupled to tuned circuits indicated though not shown through a coupling capacitor 4. An RF AGC chain including a connective means comprising a first resistor 6 is coupled to the gain control electrode 8 of the transistor 2 to alter the operating point of the amplifier otherwise operated through an emitter resistor 9 and a collector resistor 12 coupled to a common bus 11. A capacitor 10 is provided to short any undesirable A.C. signals of the AGC chain to a ground bus 11.

The operating point of the transistor 2 as maintained by the emitter resistor 9 and the collector resistor 12 is sustained by a D.C. bias supply which, in the form of a cathode circuit of a high current amplifying device or a tube 44 of a horizontal output stage 13, provides a second element of the hybrid transistor-vacuum tube combination. The emitter resistor 9 and an A.C. bypass capacitor 16 are connected to the vacuum tube D.C. bias supply through a resistor 14.

The output or the collector terminal 53 of the RF amplifier 1 is coupled to the mixer stage 17 through a coupling capacitor 19 to provide an automatic gain controlled output from the RF stage as controlled by the automatic gain control voltage applied through the resistor 6 of the AGC chain.

The output from the mixer stage 17 is then applied to the IF stage 18, one of many possible stages, which also includes the second element of the hybrid combination, namely, a vacuum tube 20. The tube 20 as shown serves as the first IF amplifier and is supplied by one of many possible conventional linking circuits 21 comprising a primary 22 and a secondary 23. The first terminal of the secondary 23 is coupled to a second gain control electrode, a grid 29 of the tube 20. A second terminal of the secondary 23 is coupled to the conventional keyer stage 24 through an AGC chain comprising a first RC filter combination including a resistor 25 and a capacitor 26 having a relatively small time constant. The AGC chain includes D.C. coupling through the resistor 25 to a resistor 27 of a second RC filter combination including a capacitor 28 which has a relatively large time constant.

As is well known in the art, the keyer stage 24 is supplied by a source of keyer pulses or flyback pulses from a horizontal deflection circuit to provide a sampling of the television signals only during horizontal sychronizing pulse intervals. As a result, scene brightness is excluded from affecting the automatic gain control of the RF stage 1 and the IF stage 18 at the grid 29 of the tube 20.

The cathode biasing configuration of the tube 20 comprises a cathode circuit in the form of a series resistor combination comprising a first resistor 30 and a second resistor 32 joined at an intermediate terminal 33 and connecting a cathode electrode 34 to the common bus 11. The terminal 33 is coupled to the common bus 11 through an A.C. bypass capacitor 35 and to the connective means of the AGC chain including a series resistor combination comprising the resistor 6 and a resistor 36. The resistor 6 and the resistor 36 are joined at an intermediate terminal 37 to which the anode of the delay diode 38 is connected.

The anode or plate circuit configuration of the tube 20 comprises a B+ voltage source which is D.C. coupled to plate 42 of the tube 20 through an output primary 41 for a secondary 54 and a resistor 39. The suppressor grid of the tube as shown is shorted to the common bus 11 through a lead 43 while the resistor 39 is connected directly to the screen 40. The screen 40 is in turn connected to the bus 11 through a neutralizing capacitor 55.

In order to obtain a low impedance source of D.C. power to bias the delay diode 38 with no additional circuitry, the invention turns to an available high current tube providing a constant voltage through a low impedance portion of a cathode circuit readily available in the conventional television receiver. The previously mentioned high current tube 44 may comprise a tetrode or pentode and may be found in the horizontal output stage 13. As shown, the tube 44 is connected to a cathode series resistor combination comprising a first resistor 45 and a second resistor 46 joined by an intermediate terminal 47 and coupling a cathode electrode 48 to the common bus 11. The series resistor combination is shunted by an A.C. bypass capacitor 49 while the grid 50 is connected to the horizontal drive.

Thus, in addition to serving a D.C. supply for the RF stage 1 and an amplifier for the horizontal output signals to the horizontal output transformer, the horizontal output stage 13 serves a second function by appropriately biasing the diode 38 which is connected at the cathode to the intermediate terminal 47.

In order to maintain the gain of the tube 20 at a satisfactorily high level, the overall bias provided by the voltage difference between the grid 29 and the cathode 34 should be kept to a minimum on very weak signals. This is accomplished in the preferred embodiment by connecting a load resistor 52 to the intermediate terminal 33 as opposed to the common bus 11 thereby providing a significantly lower negative voltage between the grid 29 and the cathode 34 than would be the case if the keyer load resistor 52 were returned to the bus 11 as is done in some conventional tube circuits.

In operation, the voltage across the resistor 32 is at a maximum when little or no signal is available at the grid 29. As the signal strength increases, the tube 20 will be driven toward cutoff by the AGC voltage thereby reducing the voltage drop across the resistor 32. The change in voltage from the keyer stage 24 which reflects the change in signal strength is supplied immediately to the grid 29 through the AGC chain. A proper choice of the resistor 32, the resistor 36, and the resistor 46 will forward bias the diode 38 sufficiently to provide the needed delay. When the voltage at terminal 37 falls below the voltage at terminal 47, the diode 38 will be reversed biased to allow the voltage at the gain control electrode to vary with the voltage across the connective means comprising the resistor 6 and the resistor 36. Essentially then, the value of the resistor 46 is chosen to provide a reference voltage at which it is desirable to start the gain reduction in the RF stage 1.

As shown, an RF AGC voltage is required which will drive the gain control electrode more positive when the signal becomes weaker. Hence, as the incoming signal increases, the gain control electrode 8 is driven less positive thereby driving the transistor 2 toward saturation. Of course, it is appreciated that substitution of an NPN transistor for the PNP transistor 2 may be made if corresponding changes in the biasing circuit of the diode 38 are also made.

As shown, the preferred embodiment utilized a single IF stage although a plurality of IF stages may be utilized and the cathode circuit of any one of the regulated stages could be used in the AGC chain to effect this hybrid automatic gain control with the necessary delay.

It is also appreciated that the horizontal output stage is not the only constant voltage low impedance source presently available in a television receiver. Actually, the cathode circuit of any high current tube could be utilized as long as the voltage maintained across a low impedance is sufficiently constant to maintain the desired delay through the diode 38.

Although specific embodiments of the invention have been shown and described, it is not desired that the invention be limited to the particular form shown and described, and it is intended by the appended claims to cover all modifications within the spirit and scope of the invention.

What is claimed as new and desired to be secured by Letters Patent of the United States is:

1. In a hybrid receiver comprising an RF stage including a transistor amplifier with a first gain control electrode and an output electrode, an IF stage including an amplifying device with a second gain control electrode and a first cathode electrode, and a keyer stage for providing automatic gain control voltage to the control electrode of the IF stage, means for controlling the gain of the RF stage comprising:

(a) first cathode circuit means coupled to said first cathode electrode for deriving a first voltage therefrom;

(b) means for providing a predetermined voltage including a high current amplifying device;

(c) connective circuit means for coupling said first cathode circuit means to said first gain control electrode; and (d) a diode connected between said connective circuit means and said means for providing a predetermined voltage, for delaying the application of said first voltage derived from said first cathode circuit means to said first gain control electrode.

2. The hybrid receiver as recited in claim 1 wherein said first cathode circuit means comprises a series resistor combination having a first intermediate terminal therein, and said means providing a source of predetermined voltage includes a second cathode circuit comprising a second series resistor combination coupled to said high current amplifying device, said second series resistor combination having a second intermediate terminal therein, said first intermediate terminal being connected to said connective circuit means and said second intermediate terminal being connected to said diode.

3. The hybrid receiver as recited in claim 2 wherein said first cathode circuit and said second cathode circuit are connected to a common bus.

4. The hybrid receiver as recited in claim 3, further including a load resistor connected between said keyer stage and said first intermediate terminal.

5. The hybrid receiver as recited in claim 4, wherein the connective circuit means comprises a third series resistor combination having a third intermediate terminal therein, said diode being connected to said third intermediate terminal.

6. The hybrid receiver as recited in claim 4, wherein said high current amplifying device is included within a horizontal output stage of a television receiver.

7. The hybrid receiver as recited in claim 5, wherein said diode includes an anode electrode and cathode electrode, the cathode electrode being coupled to said second intermediate terminal and the anode electrode being connected to said third intermediate terminal of said connective circuit means.

References Cited

UNITED STATES PATENTS

| | | | |
|---|---|---|---|
| 2,977,411 | 3/1961 | Goodrich. | |
| 3,084,216 | 4/1963 | Tschannen | 325—405 XR |
| 3,192,316 | 6/1965 | Humphrey | 325—405 XR |
| 3,205,444 | 9/1965 | Birkenes | 325—405 XR |
| 3,244,982 | 4/1966 | Barton | 325—410 |
| 3,341,780 | 9/1967 | Sethna | 325—410 XR |
| 3,344,355 | 9/1967 | Massman | 325—410 XR |
| 3,414,820 | 12/1968 | Siwko et al. | 325—410 |

ROBERT L. GRIFFIN, Primary Examiner

R. S. BELL, Assistant Examiner

U.S. Cl. X.R.

325—318, 405, 410